(12) United States Patent
Chen et al.

(10) Patent No.: US 7,939,247 B2
(45) Date of Patent: May 10, 2011

(54) PROCESS OF PATTERNING SMALL SCALE DEVICES

(75) Inventors: An Chen, Sunnyvale, CA (US); Zoran Krivokapic, Santa Clara, CA (US)

(73) Assignee: Globalfoundries Inc., Grand Cayman (KY)

( * ) Notice: Subject to any disclaimer, the term of this patent is extended or adjusted under 35 U.S.C. 154(b) by 221 days.

(21) Appl. No.: 12/201,993

(22) Filed: Aug. 29, 2008

(65) Prior Publication Data
US 2010/0055577 A1    Mar. 4, 2010

(51) Int. Cl.
G03F 7/00    (2006.01)
G03F 1/00    (2006.01)
(52) U.S. Cl. ............... 430/312; 430/313; 430/5
(58) Field of Classification Search ...... 430/5, 311–313, 430/315, 319, 321–324; 435/6; 438/167, 438/199, 238, 257, 401
See application file for complete search history.

(56) References Cited

U.S. PATENT DOCUMENTS

| | | | |
|---|---|---|---|
| 5,656,525 A * | 8/1997 | Lin et al. | 216/11 |
| 7,713,818 B2 * | 5/2010 | Chan | 438/257 |
| 2004/0023253 A1 * | 2/2004 | Kunwar et al. | 435/6 |
| 2008/0057445 A1 * | 3/2008 | Brueck et al. | 430/323 |
| 2008/0286954 A1 * | 11/2008 | Kim et al. | 438/525 |

OTHER PUBLICATIONS

Claire Berger, Zhimin Song, Tianbo Li, Xuebin Li, Asmerom Y. Ogbazghi, Rui Feng, Zhenting Dai, Alexei N. Marchenkov, Edward H. Conrad, Phillip N. First, and Walt A. De Heer; "Ultrathin Epitaxial Graphite: 2D Electron Gas Properties and a Route toward Graphene-based Nanoelectronics"; J. Phys. Chem. B 2004, 108, pp. 19912-19916.

K. S. Novoselov, et al.; "Electric Field Effect in Atomically Thin Carbon Films"; Science 306, pp. 666-609 (2004); DOI: 10.1126/science.1102896; Oct. 22, 2004 vol. 306 Science.

Scott Gilje, Song Han, Minsheng Wang, Kang L. Wang, and Richard B. Kaner; "A Chemical Route to Graphene for Device Applications"; Nano Letters, 2007, vol. 7 No. 11, pp. 3394-3398.

* cited by examiner

Primary Examiner — Stephen Rosasco
Assistant Examiner — Steward A Fraser
(74) Attorney, Agent, or Firm — Ditthavong Mori & Steiner, P.C.

(57) ABSTRACT

A process is provided that includes forming a first mask on an underlying layer, where the mask has two adjacent portions with an open gap therebetween, and depositing a second mask material within the open gap and at an inclined angle with respect to an upper surface of the underlying layer to form a second mask. In another implementation, a process is provided that includes forming a first mask on an underlying layer, where the mask has a pattern that includes an open gap, and depositing a second mask material within the open gap to form a second mask, where particles of the second mask material are directed in parallel or substantially in parallel to a line at an inclined angle with respect to an upper surface of the underlying layer.

20 Claims, 4 Drawing Sheets

PROCESS OF PATTERNING SMALL SCALE DEVICES

BACKGROUND OF THE INVENTION

1. Field of the Invention

The present invention relates to fabrication of devices having accurately formed designed features on small scales.

2. Discussion of the Background

The formation of various integrated circuit (IC) structures on a wafer often relies on lithographic processes, sometimes referred to as photolithography, or simply lithography. As is well known, lithographic processes can be used to transfer a pattern of a photomask (also referred to as a "reticle") to a wafer. Patterns can be formed from a photoresist layer disposed on the wafer by passing light energy through the photomask mask to form an image of the desired pattern onto the photoresist layer. As a result, the pattern is transferred to the photoresist layer. In areas where the photoresist is sufficiently exposed, after a development cycle the photoresist material can become soluble such that it can be removed to selectively expose an underlying layer (e.g., a semiconductor layer, a non-semiconductor layer, a metal or metal containing layer, a dielectric layer, a hard mask layer, etc.). Portions of the photoresist layer not exposed to a threshold amount of light energy will not be removed and will serve to protect the underlying layer during further processing of the wafer (e.g., etching exposed portions of the underlying layer, implanting ions into the wafer, etc.). Thereafter, the remaining portions of the photoresist layer can be removed.

There is a continuing objective to increase the density with which various integrated circuit structures are arranged. To this end feature size, line width, and the separation between features and lines are becoming increasingly smaller. Fabrication in the sub-micron range incurs limitations in faithfully reproducing reticle patterns as exposed images on the photoresist layer. Yield is affected by factors such as mask pattern fidelity, optical proximity effects and photoresist processing.

Nodes with a critical dimension of about 32 nanometers (nm) to about 65 nm have been proposed, and in the future 22 nm or below may be needed. In these sub-micron processes, yield is affected by factors such as mask pattern fidelity, optical proximity effects and photoresist processing. These concerns are largely dependent on local pattern density and topology. For example, for a repetitive line pattern, a minimum printable pitch for a single exposure of the photoresist through the mask reticle can be determined. That is, a pitch smaller than the minimum pitch will produce an unacceptable exposure pattern.

One approach for overcoming such problems has been to employ two photoresist layers each subjected to exposure through a reticle. For example, a first resist pattern is formed over a target layer and then the resist pattern may be covered by a cover layer. A second resist pattern can then be formed on the cover layer over the first resist pattern leaving exposed portions of the cover layer. The cover layer can then be selectively etched to remove the exposed portions of the cover layer. A target pattern is defined by the first and second resist patterns. The target pattern may be used as a mask for etching the target layer. However, such a double exposure technique presents difficulties in appropriately overlaying the various layers with each other and with the one or more patterned masks that may be required.

Thus, the need exists to develop a process for forming devices with smaller feature sizes, without the drawbacks and problems associated with the processes discussed above.

SUMMARY OF THE INVENTION

The present invention advantageously provides embodiments of a process that includes forming a first mask on an underlying layer, where the mask has two adjacent portions with an open gap therebetween, and depositing a second mask material within the open gap and at an inclined angle with respect to an upper surface of the underlying layer to form a second mask.

The present invention further advantageously provides embodiments of a process that includes forming a first mask on an underlying layer, where the mask has a pattern that includes an open gap, and depositing a second mask material within the open gap to form a second mask, where particles of the second mask material are directed in parallel or substantially in parallel to a line at an inclined angle with respect to an upper surface of the underlying layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1A:
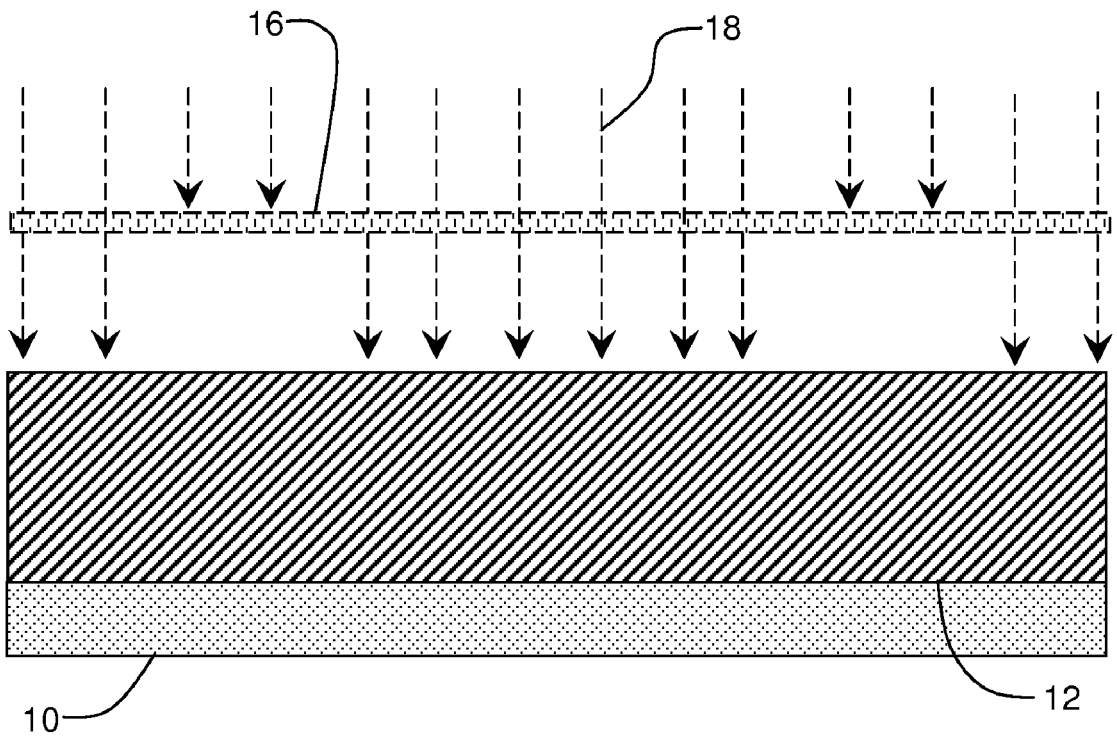
FIGS. 1A-1D depict a process of forming a mask pattern of small scale, according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

FIGS. 1A-1D depict a process of forming a mask pattern of small scale, according to an embodiment of the present invention. The process includes the use of a first mask and angled deposition of a second mask material in order to pattern or form a second mask of sub-resolution feature size.

FIG. 1A depicts initial stages of patterning a photoresist layer. In the initial stages, an underlying layer 10 is provided. The underlying layer 10 is the material layer that will ultimately be etched using the photolithography process. Thus, the underlying layer can be, for example, a semiconductor material, a non-semiconductor material, a metal or metal containing layer, a dielectric layer, a hard mask layer, or any other material that may be etched to form various structures, implanted with ions, or further processed in any manner through the use of a mask. A photoresist layer 12 is deposited on an upper surface of the underlying layer 10. Additionally, a photomask 16 is provided above the photoresist layer 12. The photomask 16 is patterned to allow light energy 18 to pass through portions thereof and to block light energy from passing through other portions thereof. Thus, the photomask 16 allows a pattern of the light energy 18 to pass therethrough and contact the photoresist layer 12, in order to form an image on the photoresist layer 12.

As a result of the exposure of light energy, portions of the photoresist layer that are exposed to the light energy in FIG.

Figure 1B:
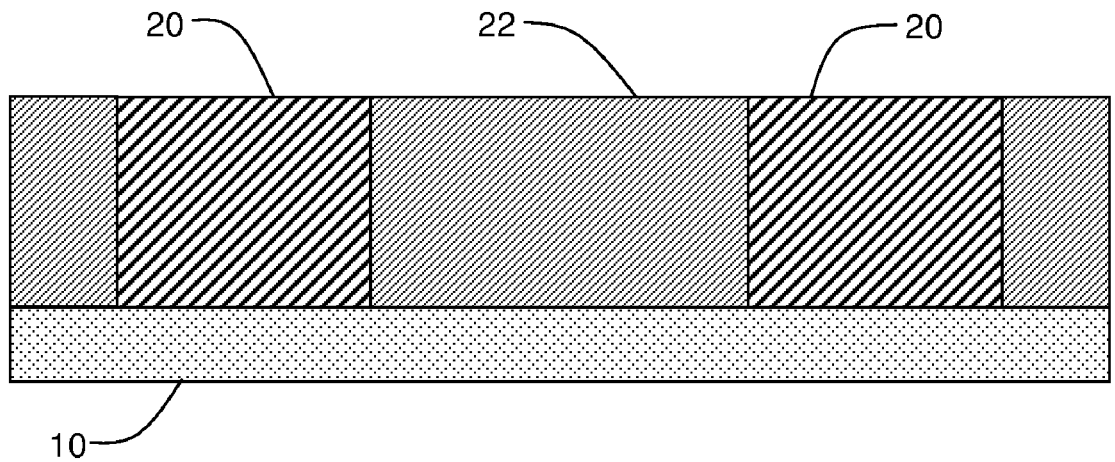
Figure 1C:
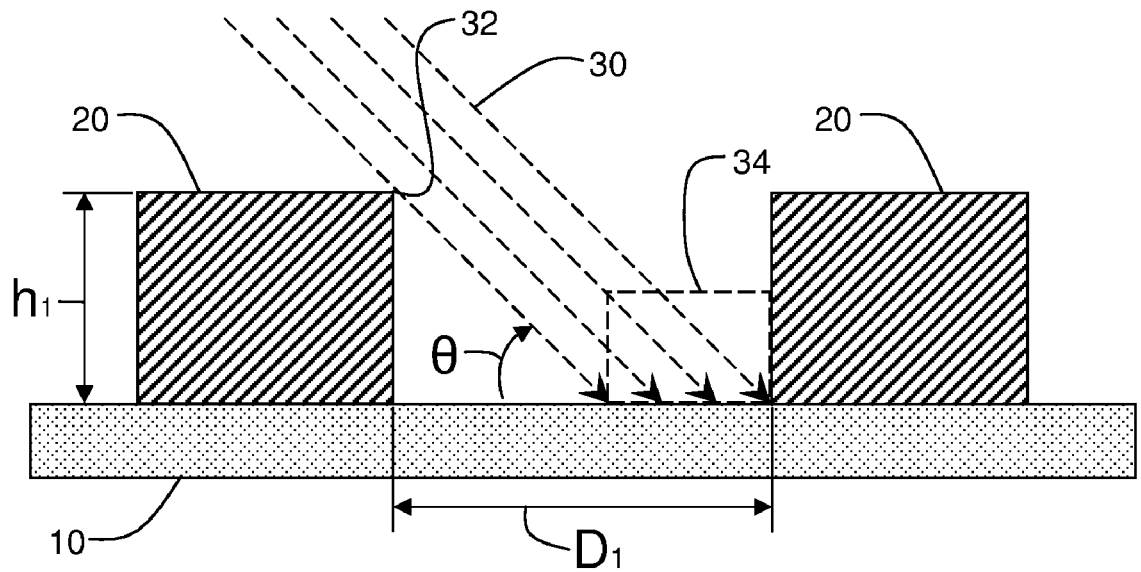

1A become soluble to a developer solution, while non-exposed portions remain insoluble to the developer solution. Thus, as shown in FIG. 1B, the photoresist layer is transformed into mask portions 20, which in this case were not exposed to the light energy and are therefore insoluble, and soluble portions 22. The developer solution is used to remove the soluble portions 22, while leaving the mask portions 20 on the underlying layer 10, to form a structure as shown in FIG. 1C. Note that, alternatively, a negative photoresist layer can be used if desired in which exposed portions become insoluble to a developer solution, while non-exposed are soluble to the developer solution.

In FIG. 1C, mask portions 20, also referred to here as a first mask, are used to form a second mask of sub-resolution feature size. More specifically, in FIG. 1C, a second mask material (e.g., various metals, various oxides, etc.) is deposited at an inclined angle θ with respect to the upper surface of the underlying layer 10 in a direction substantially parallel to or substantially parallel to projection lines 30. The angle θ is between $\tan^{-1}(h_1/D_1)$ and 90°. As an example, for $h_1=D_1/2$, θ is between 30° and 90°, and the exact value depends on the target feature size. In a sufficiently high vacuum (e.g., above $10^{-4}$ mbar), particles of the second mask material have a long mean free path and travel in straight or substantially straight lines from a source of the particles onto the underlying layer 10. Thus, some of the particles of the second mask material travelling in parallel or substantially in parallel to projection lines 30 in FIG. 1C will be blocked by the left mask portion 20; however, particles of the second mask material that pass over the edge 32 of the left mask portion 20 and into an open gap area in between the two mask portions 20 shown will collect against the right mask portion 20 at an area 34 shown by a dashed-line box.

Figure 1D:
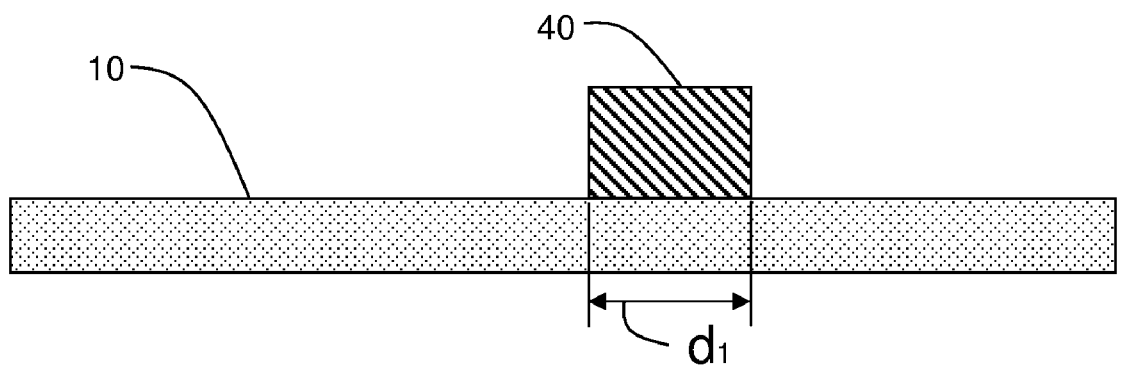

Using the deposition process shown in FIG. 1C, a second mask 40 (see FIG. 1D) can be formed. In FIG. 1D, the first mask including mask portions 20 have been removed, and thus the second mask 40 remains on the underlying layer 10. The second mask 40 can then be used as a mask to perform etching or implantation or other processes that require such a mask.

As can be seen in FIG. 1C, the first mask 20 can be formed to provide a resolution size limit $D_1$ that is as small as the photolithography process allows. The resolution size limit $D_1$ as depicted in FIG. 1C is an open gap between adjacent portions of the first mask 20, and the gap is the portion of the underlying layer that is left exposed by the pattern of the first mask. Additionally, the first mask 20 can be formed to have a height $h_1$ that is within the limits allowed by such photolithography processes or other processes used to control height. Additionally, by controlling the angle or tilt θ of the deposition of the second mask material with respect to the upper surface of the underlying layer 10 (e.g., either by tilting the underlying layer, the deposition source, or a combination of both), a resolution size $d_1$ of the second mask 40 can be controlled. Thus, the aspect ratio of the first mask and the deposition angle of the second mask material can be used to determine the size of the second mask 40, for example, using the equation $d=D-(h\div\tan(\theta))$. At any positive angle θ that is less than ninety degrees (also referred to herein as an inclined angle), the size $d_1$ of the second mask 40 will be less than the size limit $D_1$.

FIGS. 2A-2D depict a process of forming a graphene layer of small scale, which can be used, for example, to form a graphene-based device, according to another embodiment of the present invention.

Figure 2A:
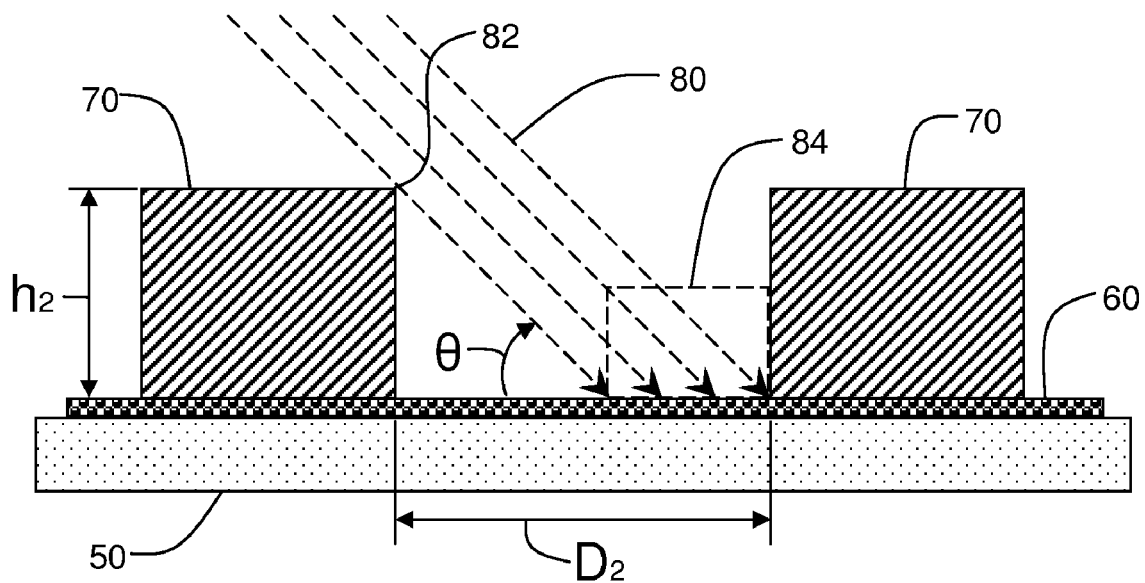
FIGS. 2A-2D depict a process of forming a graphene layer of small scale, which can be used, for example, to form a graphene-based device, according to another embodiment of the present invention.

FIG. 2A depicts a substrate layer 50, a graphene layer 60 provided on an upper surface of the substrate layer 50, and first mask portions 70, which are formed, for example, in a manner as described with respect to FIGS. 1A and 1B. Graphene has attracted great attention for electronic applications due to its extremely high mobility (e.g., over 200,000 $cm^2/V\cdot s$) and some unique properties (e.g., bandgap modulation by structure); however, graphene has to be made extremely small (e.g., 10 nm or smaller) to exhibit some unique physical properties, and thus small resolution size for graphene features can be important for certain applications thereof. The graphene layer 60 can be prepared, for example, by using mechanical exfoliation of highly-oriented graphite (see, e.g., K. S. Novoselov, et al, "Electric Field Effect in Atomically Thin Carbon Films", Science 306, 666 (2004)), by growing graphene using thermal decomposition of a carbon-containing graphene precursor (e.g., SiC) (see, e.g., C. Berger, et al., "Ultrathin Epitaxial Graphite: 2D Electron Gas Properties and a Route toward Graphene-based Nanoelectronics", J. Phys. Chem. B 108, 19912 (2004)), by using chemical synthesis (see, e.g., S. Gilje, et al., "A Chemical Route to Graphene for Device Applications", Nano Lett. 7, 3394 (2007)), etc.

Figure 2B:
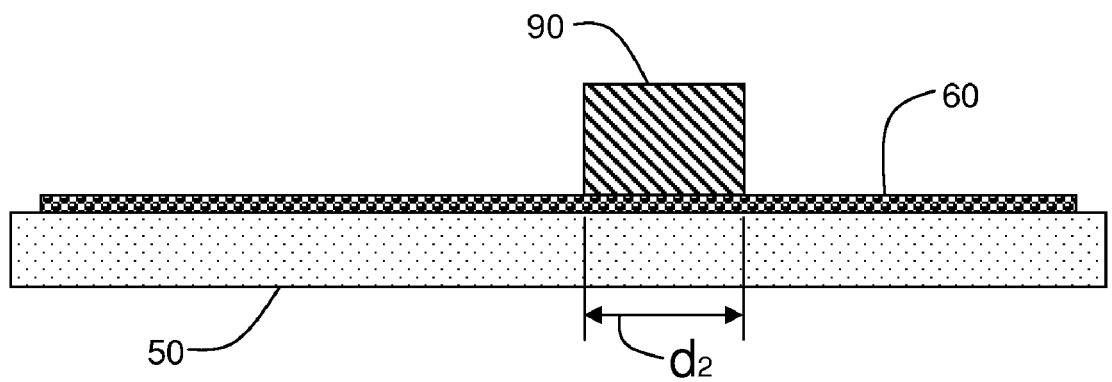
Figure 2C:
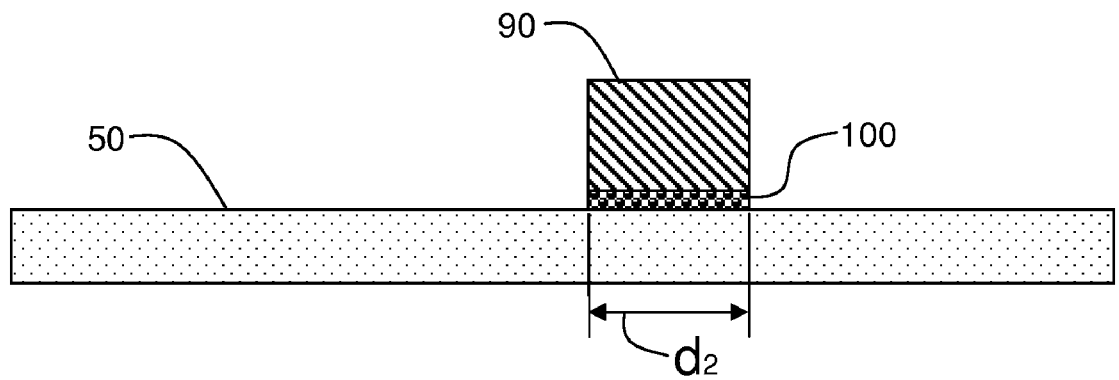
Figure 2D:
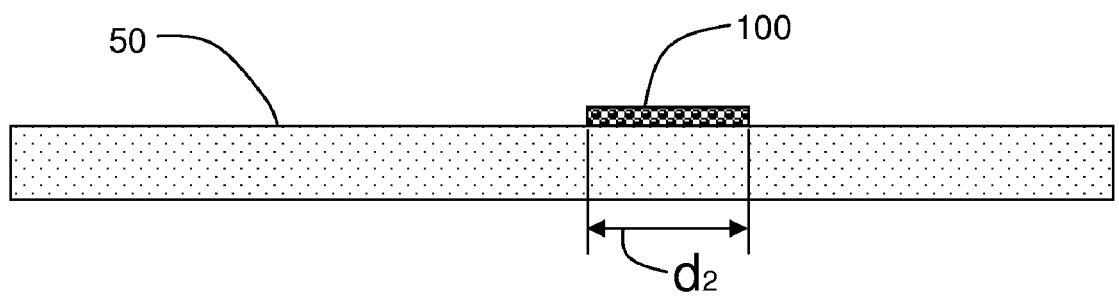

As can be seen in FIGS. 2A and 2B, a second mask 90 is formed in the same manner as depicted in FIGS. 1C and 1D. In FIG. 2A, mask portions 70, also referred to here as a first mask, are used to form a second mask of sub-resolution feature size. More specifically, in FIG. 2A, a second mask material (e.g., various metals, various oxides, etc.) is deposited at an angle θ with respect to the upper surface of the graphene layer 60 in a direction substantially parallel to or substantially parallel to projection lines 80. In a sufficiently high vacuum, particles of the second mask material have a long mean free path and travel in straight or substantially straight lines from a source of the particles onto the graphene layer 60. Thus, some of the particles of the second mask material travelling in parallel or substantially in parallel to projection lines 80 in FIG. 2A will be blocked by the left mask portion 70; however, particles of the second mask material that pass over the edge 82 of the left mask portion 70 and in between the two mask portions 70 shown will collect against the right mask portion 70 at an area 84 shown by a dashed-line box.

Using the deposition process shown in FIG. 2A, a second mask 90 (see FIG. 2B) can be formed. In FIG. 2B, the first mask including mask portions 70 have been removed, and thus the second mask 90 remains on the underlying layer 60. The second mask 90 can then be used as a mask to perform etching of the graphene layer 60. Thus, by performing an etching process using the second mask 90 as a mask, the exposed portions of the graphene layer 60 are removed, thereby resulting in the structure shown in FIG. 2C with non-exposed graphene layer portion 100 remaining under the second mask 90. Then, the second mask can be removed, thereby leaving the graphene layer portion 100 remaining on substrate 50, such that the graphene layer portion 100 can be further processed to form a graphene-based device.

As can be seen in FIG. 2A, the first mask 70 can be formed to provide a resolution size limit $D_2$ that is as small as the photolithography process allows. Additionally, the first mask 70 can be formed to have a height $h_2$ that is within the limits allowed by such photolithography processes or other processes used to control height. Additionally, by controlling the angle or tilt θ of the deposition of the second mask material with respect to the upper surface of the graphene layer 60, a resolution size $d_2$ of the second mask 90 can be controlled. Thus, the aspect ratio of the first mask and the deposition angle of the second mask material can be used to determine the size of the second mask 90, for example, using the equation $d=D-(h \div \tan(\theta))$. At any positive angle $\theta$ that is less than ninety degrees, the size $d_2$ of the second mask 90 will be less than the size limit $D_2$.

Thus, a process is provided that uses an angled deposition and a two-step mask technique to define patterns smaller than the resolution limit of lithography. One of the applications of this technique is on graphene devices. Graphene devices need to be made extremely small (e.g., 10 nm or smaller) to exhibit some unique physical properties. The feature size is smaller than current photolithography resolution. While E-beam lithography can achieve small sizes, achieving a size small enough for graphene device features can be challenging, and, in addition, E-beam lithography is not typically suitable for production as it is expensive and has low throughput.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A process comprising:
   forming a first mask on an underlying layer, the first mask having two adjacent portions with an open gap therebetween; and
   depositing a second mask material within the open gap and at an inclined angle with respect to an upper surface of the underlying layer to form a second mask,
   wherein an edge of the first mask blocks the deposition of the second mask material on a portion of the open gap that is adjacent to the edge wherein sidewalls of the first mask forming the open gap extend in a substantially perpendicular manner from the upper surface of the underlying layer to the edge, and
   wherein the second mask formed within the open gap abuts the first mask on a side of the open gap opposite to the edge.

2. The process according to claim 1, further comprising:
   removing the first mask; and
   performing processing on the underlying layer using the second mask as a mask for the processing.

3. The process according to claim 2, comprising performing processing on the underlying layer that includes etching of exposed portions of the underlying layer or performing ion implantation on exposed portions of the underlying layer.

4. The process according to claim 1, wherein the underlying layer is graphene.

5. The process according to claim 1, wherein the second mask has a feature size that is less than a feature size of the first mask.

6. The process according to claim 5, comprising forming the first mask on an underlying layer using a lithography process, wherein the feature size of the second mask is less than a resolution limit of the lithography process.

7. The process according to claim 6, wherein the underlying layer is graphene.

8. The process according to claim 7, further comprising:
   removing the first mask; and
   etching exposed portions of the underlying layer using the second mask as a mask.

9. The process according to claim 1, comprising depositing the second mask material by directing particles of the second mask material to travel in a straight line or in a substantially straight line from a source of the second mask material to the upper surface of the underlying layer.

10. The process according to claim 1, comprising controlling a feature size of the second mask by controlling an aspect ratio of the first mask and a value of the inclined angle.

11. A process comprising:
    forming a first mask on an underlying layer, the first mask having a pattern that includes an open gap; and
    depositing a second mask material within the open gap to form a second mask, wherein particles of the second mask material are directed in parallel or substantially in parallel to a line at an inclined angle with respect to an upper surface of the underlying layer,
    wherein an edge of the first mask blocks the deposition of the second mask material on a portion of the open gap that is adjacent to the edge, and
    wherein the second mask formed within the open gap abuts the first mask on a side of the open gap opposite to the edge wherein sidewalls of the first mask forming the open gap extend in a substantially perpendicular manner from the upper surface of the underlying layer to the edge.

12. The process according to claim 11, further comprising:
    removing the first mask; and
    performing processing on the underlying layer using the second mask as a mask for the processing.

13. The process according to claim 12, comprising performing processing on the underlying layer that includes etching of exposed portions of the underlying layer or performing ion implantation on exposed portions of the underlying layer.

14. The process according to claim 11, wherein the underlying layer is graphene.

15. The process according to claim 11, wherein the second mask has a feature size that is less than a feature size of the first mask.

16. The process according to claim 15, comprising forming the first mask on an underlying layer using a lithography process, wherein the feature size of the second mask is less than a resolution limit of the lithography process.

17. The process according to claim 16, wherein the underlying layer is graphene.

18. The process according to claim 17, further comprising:
    removing the first mask; and
    etching exposed portions of the underlying layer using the second mask as a mask.

19. The process according to claim 11, comprising depositing the second mask material by directing the particles to travel in parallel or substantially in parallel to the line from a source of the second mask material to the upper surface of the underlying layer.

20. The process according to claim 11, comprising controlling a feature size of the second mask by controlling an aspect ratio of the first mask and a value of the inclined angle.

* * * * *